(12) United States Patent
Hilgers et al.

(10) Patent No.: US 11,264,555 B2
(45) Date of Patent: Mar. 1, 2022

(54) ELECTROACTIVE POLYMER ACTUATOR DEVICE AND DRIVING METHOD

(71) Applicant: KONINKLIJKE PHILIPS N.V., Eindhoven (NL)

(72) Inventors: Achim Hilgers, Alsdorf (DE); Daan Anton Van Den Ende, Breda (NL); Mark Thomas Johnson, Arendonk (BE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 645 days.

(21) Appl. No.: 16/307,164

(22) PCT Filed: Jun. 12, 2017

(86) PCT No.: PCT/EP2017/064291
§ 371 (c)(1),
(2) Date: Dec. 5, 2018

(87) PCT Pub. No.: WO2017/216107
PCT Pub. Date: Dec. 21, 2017

(65) Prior Publication Data
US 2019/0123256 A1    Apr. 25, 2019

(30) Foreign Application Priority Data
Jun. 13, 2016 (EP) .................... 16174115

(51) Int. Cl.
| | | |
|---|---|---|
| *H01L 41/04* | (2006.01) | |
| *H01L 41/193* | (2006.01) | |
| *H01L 27/20* | (2006.01) | |
| *H02M 3/07* | (2006.01) | |

(52) U.S. Cl.
CPC ............ *H01L 41/042* (2013.01); *H01L 27/20* (2013.01); *H02M 3/073* (2013.01); *H01L 41/193* (2013.01)

(58) Field of Classification Search
CPC ............................. H01L 41/042; H01L 41/193
USPC ................................. 310/317, 800
See application file for complete search history.

(56) References Cited

U.S. PATENT DOCUMENTS

| | | | |
|---|---|---|---|
| 2003/0067245 A1 | 4/2003 | Pelrine et al. | |
| 2003/0141787 A1 | 7/2003 | Pelrine et al. | |
| 2008/0303782 A1* | 12/2008 | Grant ................... | G06F 1/1652 345/156 |
| 2008/0304290 A1 | 12/2008 | Pelrine et al. | |
| 2009/0021114 A1 | 1/2009 | Adachi | |

(Continued)

FOREIGN PATENT DOCUMENTS

| | | |
|---|---|---|
| DE | 102014005851 A1 | 10/2015 |
| EP | 2654194 A1 | 10/2013 |

(Continued)

*Primary Examiner* — Derek J Rosenau
(74) *Attorney, Agent, or Firm* — Schott, P.C.

(57) ABSTRACT

An actuator device comprises an electroactive polymer actuator (116) and a control circuit for driving the electroactive polymer actuator. The control circuit comprises a voltage boosting circuit including at least a capacitor (114; C11, C12, C13). An electroactive polymer layer (110) forms the electroactive polymer actuator in an active region (112) as well as a dielectric layer of the capacitor in a passive region (111). This provides integration of components to enable cost reductions and miniaturization.

20 Claims, 8 Drawing Sheets

(56) References Cited

U.S. PATENT DOCUMENTS

| | | |
|---|---|---|
| 2009/0085444 A1 | 4/2009 | Alvarez et al. |
| 2012/0019223 A1 | 1/2012 | Pelrine et al. |
| 2013/0100575 A1 | 4/2013 | O'Brien et al. |
| 2013/0176608 A1 | 7/2013 | Brokken et al. |
| 2015/0097536 A1 | 4/2015 | Van Kessel |

FOREIGN PATENT DOCUMENTS

| | | |
|---|---|---|
| JP | H05-129672 A | 5/1993 |
| JP | 2011-166930 A | 8/2011 |
| JP | 2011-167017 A | 8/2011 |
| JP | 2014-140028 A | 7/2014 |
| RU | 2568944 C2 | 11/2015 |
| WO | 2010054115 A1 | 5/2010 |
| WO | 2011/105913 A1 | 9/2011 |

* cited by examiner

ELECTROACTIVE POLYMER ACTUATOR DEVICE AND DRIVING METHOD

CROSS-REFERENCE TO PRIOR APPLICATIONS

This application is the U.S. National Phase application under 35 U.S.C. § 371 of International Application No. PCT/EP2017/064291, filed on Jun. 12, 2017, which claims the benefit of EP Patent Application No. EP 16174115.2, filed on Jun. 13, 2016. These applications are hereby incorporated by reference herein.

FIELD OF THE INVENTION

This invention relates to electroactive polymer actuators.

BACKGROUND OF THE INVENTION

Electroactive polymers (EAPs) are an emerging class of materials within the field of electrically responsive materials. EAPs can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP materials give rise to applicability to new applications.

An EAP device can be used in any application in which a small amount of movement of a component or feature is desired, based on electric actuation. Similarly, the technology can be used for sensing small movements. This invention relates in particular to actuators.

The use of EAPs in actuator devices enables functions which were not possible before, or offers a big advantage over common actuator solutions, due to the combination of a relatively large deformation and force in a small volume or thin form factor, compared to common actuators. EAPs actuators also give noiseless operation, accurate electronic control, fast response, and a large range of possible actuation frequencies, such as 0-1 MHz, most typically below 20 kHz.

Devices using electroactive polymers can be subdivided into field-driven and ionic-driven materials.

Examples of field-driven EAPs include Piezoelectric polymers, Electrostrictive polymers (such as PVDF based relaxor polymers) and Dielectric Elastomers. Other examples include Electrostrictive Graft polymers, Electrostrictive paper, Electrets, Electroviscoelastic Elastomers and Liquid Crystal Elastomers.

Examples of ionic-driven EAPs are conjugated/conducting polymers, Ionic Polymer Metal Composites (IPMC) and carbon nanotubes (CNTs). Other examples include ionic polymer gels.

This invention relates in particular to actuator devices which incorporate a field-driven EAP material. These devices are actuated by an electric field through direct electromechanical coupling. They require high fields (volts per meter) but low currents due to their capacitive nature. Polymer layers are usually thin to keep the driving voltage as low as possible.

A first notable subclass of field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment). Normally, metal electrodes are used since strains usually are in the moderate regime (1-5%). Other types of electrodes (such as conducting polymers, carbon black based oils, gels or elastomers, etc.) can also be used. The electrodes can be continuous, or segmented.

Another subclass of interest of field-driven EAPs is that of Dielectric Elastomers. A thin film of this material may be sandwiched between compliant electrodes, forming a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). This also constrains the type of electrodes that can be used: for low and moderate strains, metal electrodes and conducting polymer electrodes can be considered, for the high-strain regime, carbon black based oils, gels or elastomers are typically used. The electrodes can be continuous, or segmented.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

One problem with field driven electroactive polymers is the rather high operation voltages that are required, as mentioned above, to achieve high electric field strengths in the devices to realize desired deflections. Electronic driving circuits are used to generate these high voltages and to perform other signal processing. Driving voltage amplitudes of up to 1 kV are required for these EAPs, so that high voltage devices need to be used and implemented, increasing the cost (and size) of the electronics enormously.

Apart from the need for high voltages, other signal processing functions also take up space which may prevent a desired level of miniaturization.

Another issue is that the driving electronics and the EAP actuator are generally locally separated from each other resulting in the usage of high voltage feed-wires between the driver and the actuator. This however may be a safety issue for example in the case of broken wires and also results in high, unwanted (or even not-allowed) electric and magnetic fields as well as electromagnetic radiation, which may cause compliance certification issues or even could harm users.

There is therefore a need for an EAP actuator design which addresses one or more of these issues, for example to improve the possibility of miniaturization and/or enable the high voltage issue to be addressed.

SUMMARY OF THE INVENTION

The above need is at least partly fulfilled with the invention as defined by the independent claims. The dependent claims provide advantageous embodiments.

Examples in accordance with an aspect of the invention provide an actuator device for converting an electrical input into a mechanical output comprising:

an electroactive polymer actuator; and a control circuit for driving the electroactive polymer actuator, wherein the control circuit comprises a voltage boosting circuit and which comprises at least a capacitor, wherein the actuator device comprises an electroactive polymer layer having an active region for deforming as a function of an applied actuation signal and a mechanically passive region, wherein the active region forms at least a part of the electroactive polymer actuator and the mechanically passive region forms at least a part of the dielectric of the capacitor.

In this device, an EAP layer is used both to form at least part of the active actuator and to form at least part of the dielectric of a capacitor used in the control circuit. Thus, the active layer of the electroactive polymer actuator and the dielectric layer of the capacitor both at least partly comprise a part of the electroactive polymer layer. This enables miniaturization of the overall device and a reduction in (manufacturing) cost.

The voltage boosting control circuit may comprise parts which are formed using the electroactive polymer layer and parts which are external to the electroactive polymer layer. For example, the control circuit may comprise various stages, and at least one of these stages makes use of a capacitor integrated with the electroactive polymer actuator.

The control circuit may include a voltage smoothing stage comprising the capacitor in parallel with the electroactive polymer actuator. A smoothing capacitor, which is part of a voltage boosting circuit, is in this way integrated with the actuator itself.

The control circuit may comprise at least one diode and the capacitor. Capacitor-diode circuits may be used to perform various functions within a voltage boosting circuit. The diodes may be standard diodes or Zener diodes for example.

The diode may be an external component which connects to external terminals on the electroactive polymer layer. Thus, the capacitor is integrated into the structure of the actuator, and there are external terminal connections to the diode.

Instead, the diode may be a thin film layer device integrated into the electroactive polymer layer. This provides integration both of capacitor and diode components into the EAP actuator. The diode may for example be a MIM diode.

In one example, the control circuit comprises a diode in series with the electroactive polymer actuator and a capacitor in parallel with the series connection of the electroactive polymer actuator and the diode. The diode may then function as a rectifier or as a high voltage protection component which prevents high voltages of an undesired polarity reaching the actuator.

The control circuit may further comprise a discharge terminal connected to the junction between electroactive polymer actuator and the diode. This may be used for fast deactivation of the actuator which is otherwise hindered by the diode.

In another example, the control circuit comprises a diode in parallel with the electroactive polymer actuator and a capacitor in parallel with the electroactive polymer actuator. The parallel diode provides voltage protection and may for example comprise a Zener diode.

In another set of examples, the control circuit is a charge pump voltage boosting circuit. In this way, the required high voltage drive signal may be generated locally using an integrated circuit. This again has cost and miniaturization advantages, and also avoids the need for high voltage feed wires.

The charge pump control circuit for example comprises first and second capacitors, each having their dielectric formed by the electroactive polymer layer, and a diode arrangement.

The control circuit may comprise a voltage doubler circuit or plurality of voltage doubler circuits, or a voltage tripler circuit or a plurality of voltage tripler circuits.

In one set of examples, the electroactive polymer layer comprises a first portion which forms the actuator and a second remote portion which forms the dielectric layer of the capacitor. In this way, active and passive parts of the EAP layer are separated. The active parts are designed to deflect in response to a drive voltage, whereas the passive part are not intended to deform, so that any deformation is not designed for the purpose of delivering mechanical work but is incidental.

The capacitor may however be formed within the actuator area of the actuator device. This provides a more compact solution. It may be employed based on a multilayer EAP layer stack.

Examples in accordance with another aspect of the invention provide a method of driving an electroactive polymer actuator of an actuator device, comprising:

generating a drive signal using a voltage boosting control circuit which comprises at least a capacitor; and applying the drive signal to the electroactive polymer actuator, wherein the actuator device comprises an electroactive polymer layer, which forms the electroactive polymer actuator as well as a dielectric layer of the capacitor.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an actuator device comprising an electroactive polymer actuator and a control circuit for driving the electroactive polymer actuator and which comprises at least a capacitor. An electroactive polymer layer forms the electroactive polymer actuator as well as a dielectric layer of the capacitor. This provides integration of components to enable cost reductions and miniaturization.

In general terms, field driven electroactive polymer (EAP) actuators consist of an electrically isolating material, embedded between two electrically conducting electrodes. As a function of an applied voltage, the electric field between the electrodes causes a mechanical deformation of the EAP. As explained above, by using additional materials with a different extension coefficient (e.g. stiffness) to the EAP layer, the mechanical deformation can be directed in certain directions. By implementing multilayer technology, the field strength between the electrodes can be increased and hence lower voltage amplitudes are required to operate the EAP actuator, or higher mechanical deformations can be realized. This basic configuration is very similar to an electric multilayer capacitor. Hence, the basic EAP technology configuration also enables realization of electric capacitors.

Before describing the invention in detail, some examples of circuits of interest for the driving of an EAP actuator, and using capacitors, will be discussed. In particular, there are various passive voltage boosting circuits, which make use of capacitors. These are of particular interest for increasing the voltage applied to an actuator device to levels required by field-driven EAPs.

In such circuits, the capacitor functions as an electrical circuit component for processing an electrical input signal and for generating a processed electrical output signal.

Figure 1:
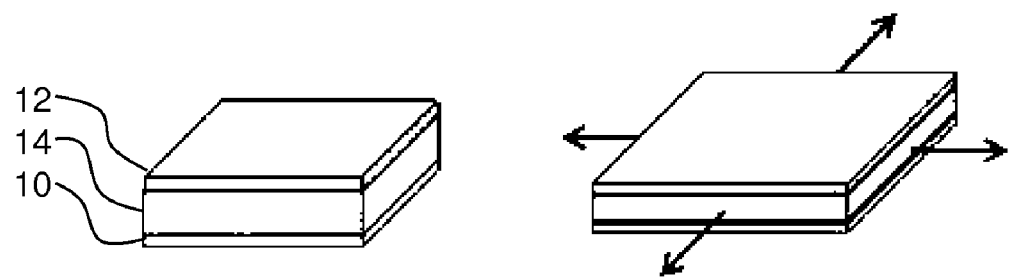
FIG. 1 shows a known electroactive polymer device which is not clamped.
Figure 2:
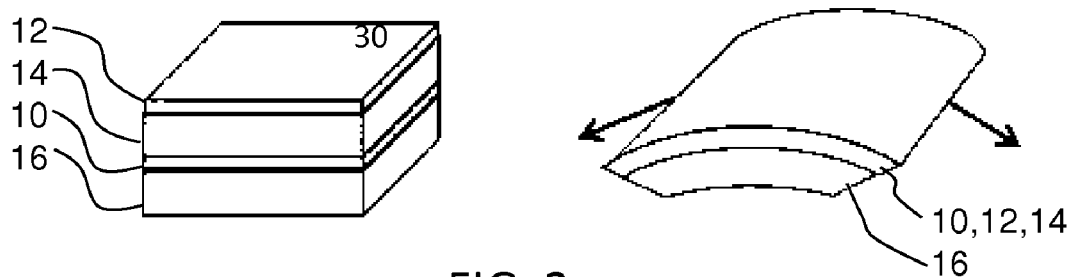
FIG. 2 shows a known electroactive polymer device which is constrained by a backing layer.
Figure 3:
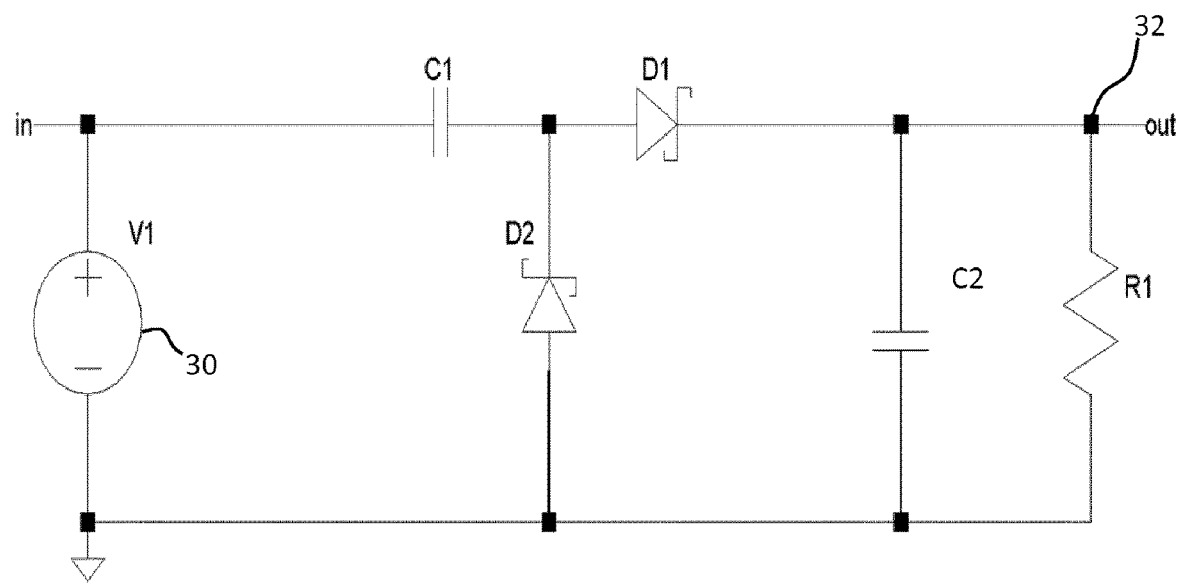
FIG. 3 shows a first example of a voltage boosting circuit.

A first possible solution for voltage boosting is the Villard/Greinacher circuit as shown in FIG. 3. It consists of two capacitors; a rectifying capacitor C1 (e.g. 100 nF) and a smoothing capacitor C2 (e.g. 470 nF) and two diodes D1 and D2.

The first capacitor C1 and first diode D1 are in series between a positive terminal of the voltage source 30 and an output terminal 32. The second diode D2 is between the junction of the first capacitor C1 and the first diode D1 and ground. The smoothing capacitor C2 is across the output in parallel with an output resistor R1 (e.g. 220 kOhm).

The output resistor represents the output load, for the purposes of analyzing the functionality of the voltage boosting circuit.

A first order equivalent circuit of an EAP consists of a series circuit of a resistor and a capacitor. If the load resistor R1 is replaced with an EAP actuator, the general impact on the output would be that the output voltage would be smoother and would be reached faster. The capacitive behavior of the EAP would act as a smoothing aid. The parallel smoothing capacitance C2 may thus be reduced in its value, or may become unnecessary.

Schottky diodes are shown, but standard diodes may be used as well. Schottky diodes are of interest for high frequency applications. The combination of C1 and D1 is called the Villard circuit; this has been extended by Greinacher by adding C2 and D2.

The two diodes D1 and D2 allow the smoothing capacitor to charge to:

$$v_{out} \cong 2 \cdot \hat{v}_{in} \qquad \text{Eq. 1}$$

Figure 4:
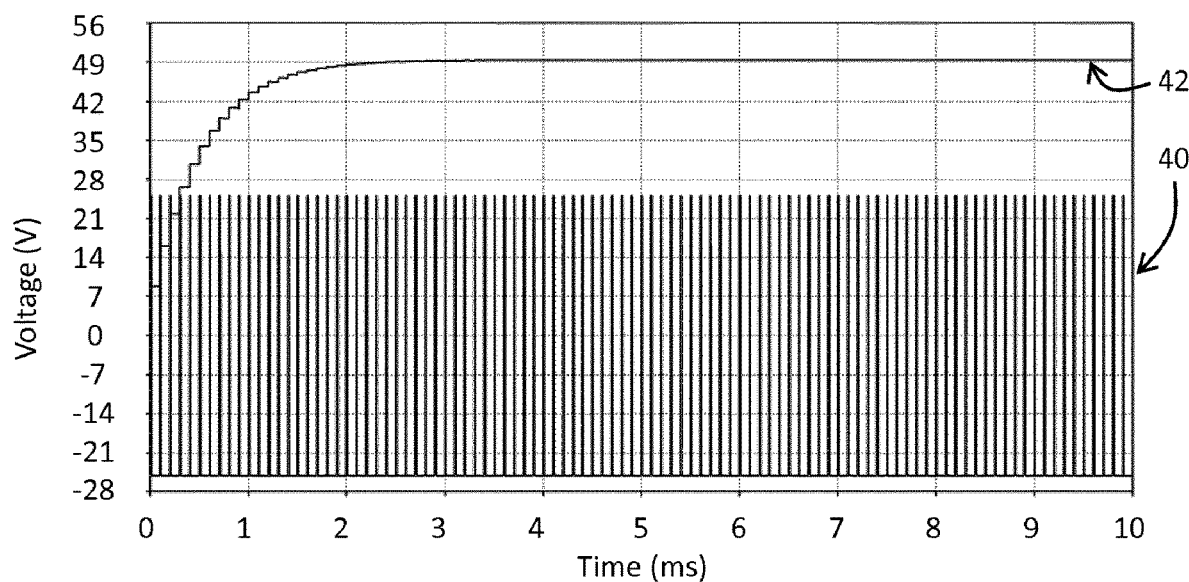
FIG. 4 shows a timing diagram to show the operation of the circuit of FIG. 3.

FIG. 4 shows the input voltage 40 as a series of pulses and shows the output voltage 42. The circuit is not a perfect voltage doubler, because two times the diode threshold voltage is subtracted from the peak input voltage.

Figure 5:
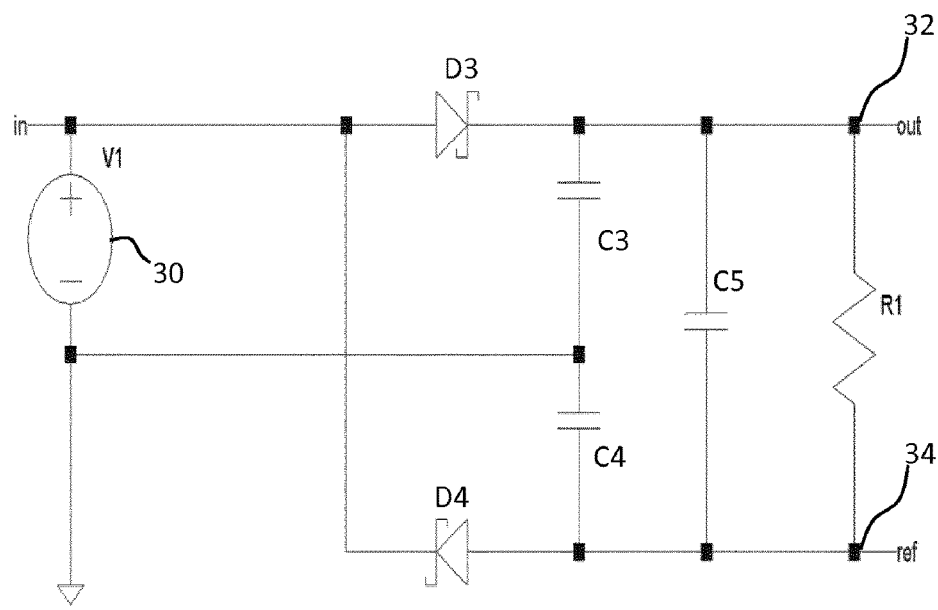
FIG. 5 shows a second example of a voltage boosting circuit.

A second approach is called the Delon-circuit, shown in FIG. 5.

It consists of a first rectifying diode D3 between a first (positive) input terminal and a first output terminal 32 and a second rectifying diode D4 between the first input terminal and a second output terminal 34 with opposite polarity. The first rectifying diode D3 charges a first capacitor C3 (between the diode and ground) and the second rectifying diode D4 charges a second capacitor C4 (between the diode and ground). The output is formed across both capacitors C3, C4, and there is a parallel smoothing capacitor C5 and output resistor R1. Each capacitor C3 and C4 is charged to almost the peak input voltage (peak voltage minus the threshold voltage of a diode).

Across the smoothing capacitor C5 approximately two times the peak input voltage applies.

$$v_{out} \cong 2 \cdot \hat{v}_{in} \qquad \text{Eq. 2}$$

Figure 6:
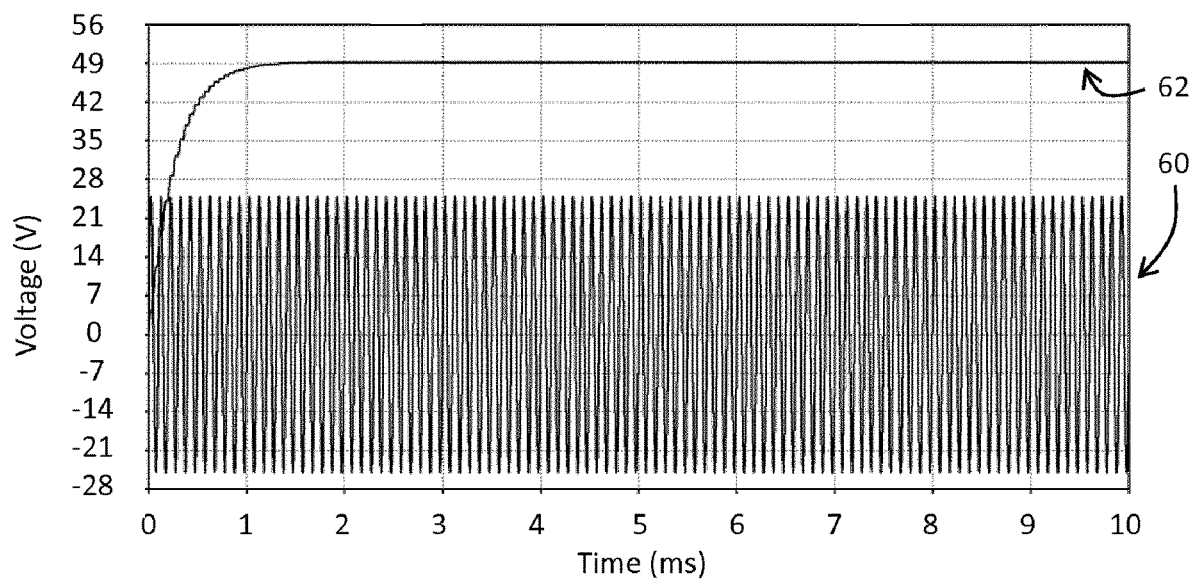
FIG. 6 shows a timing diagram to show the operation of the circuit of FIG. 5.

FIG. 6 shows the input voltage 60 as a series of pulses and shows the output voltage 62. The circuit is again not a perfect voltage doubler, because two times the diode threshold voltage is subtracted from the peak input voltage.

Figure 7:
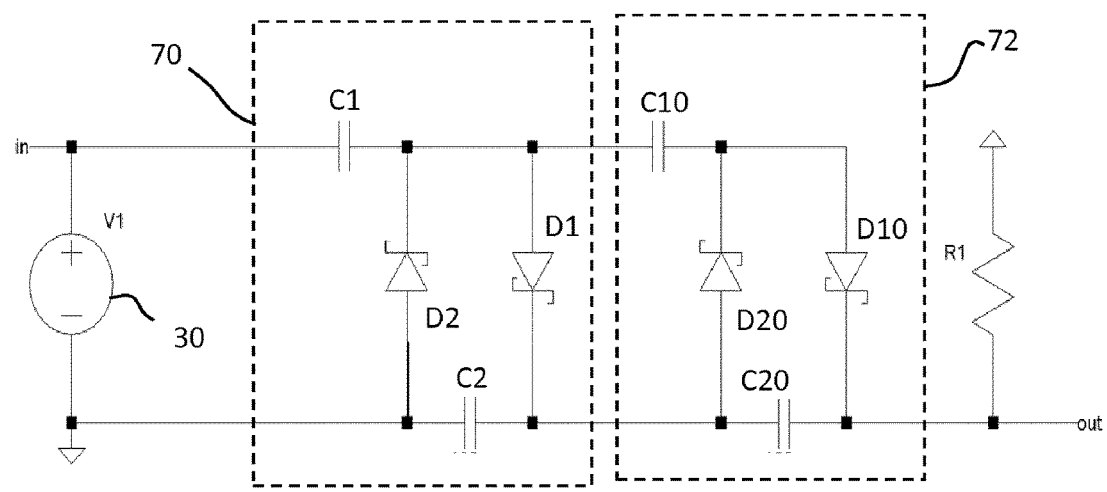
FIG. 7 shows a third example of a voltage boosting circuit.

In order to increase the output voltage to more than only about two times, so-called voltage multiplication circuits or voltage cascades may be used as well. Basically they are based on the Villard/Greinacher topology, discussed above. A simple voltage-cascade based on two Villard circuits is shown in FIG. 7.

A first stage 70 comprises a rectifying capacitor C1 and two diodes D1, D2 with a smoothing capacitor C2. A second stage 72 comprises a rectifying capacitor C10 and two diodes D10, D20 with a smoothing capacitor C20.

The final output voltage is given by:

$$v_{out} \cong 2 \cdot 2 \cdot \hat{v}_{in} \qquad \text{Eq. 3}$$

Figure 8:
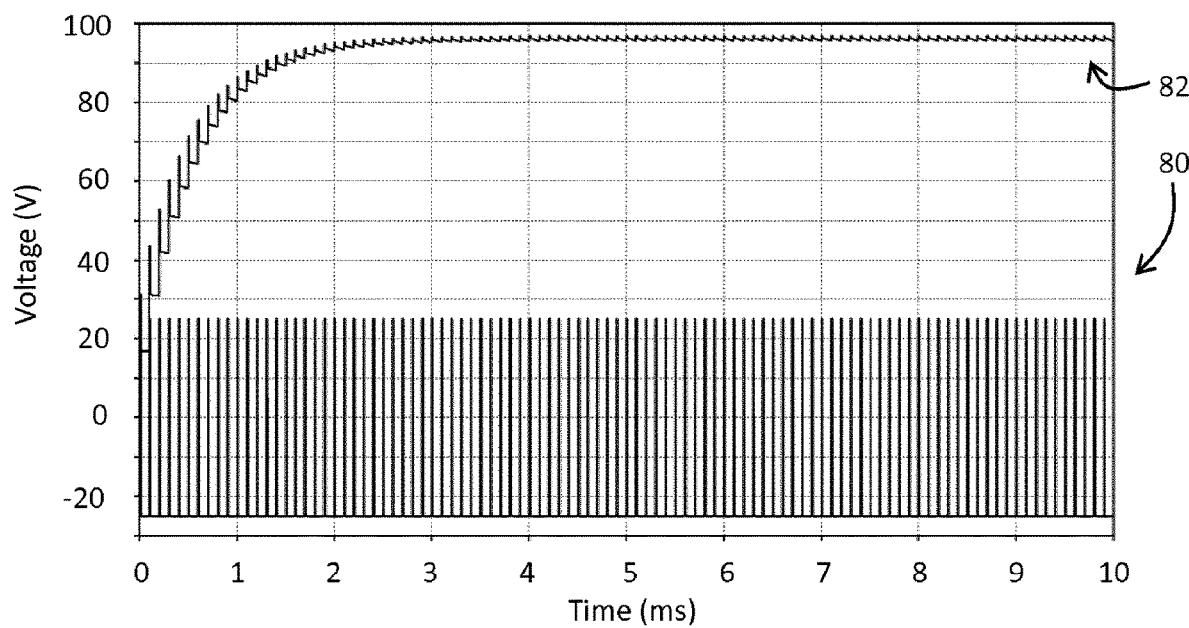
FIG. 8 shows a timing diagram to show the operation of the circuit of FIG. 7.

FIG. 8 shows the input voltage 80 as a series of pulses and shows the output voltage 82. The circuit is again not a perfect 4 times multiplication circuit, because of the diode threshold voltages.

This approach can be scaled to provide a multiplication by a factor of n if n voltage doubling circuits are used. In practice n is typically smaller than about 20. Accordingly the output voltage can be calculated to be:

$$v_{out} \cong n \cdot 2 \cdot \hat{v}_{in} \qquad \text{Eq. 4}$$

Figure 9:
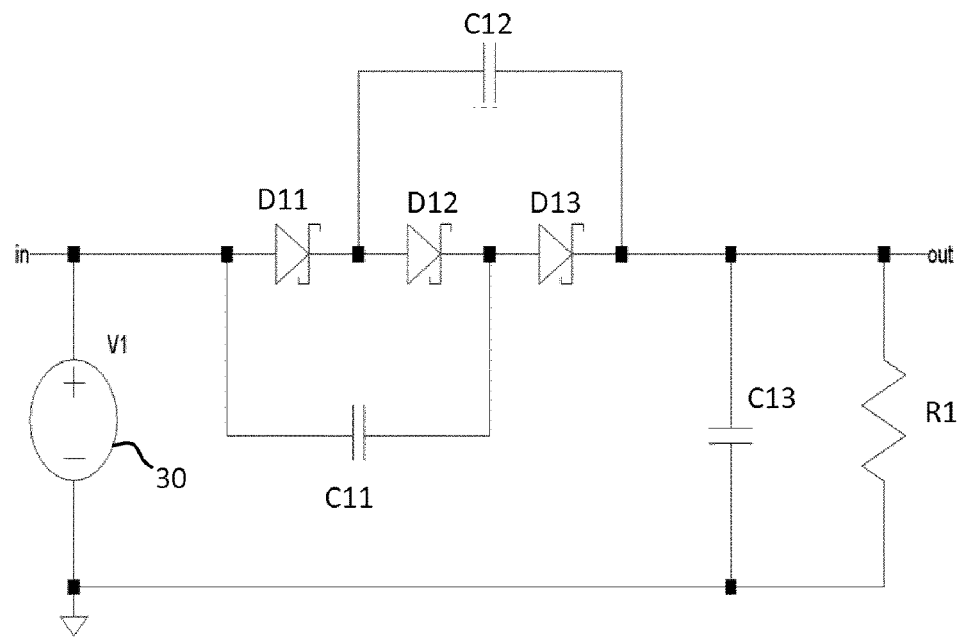
FIG. 9 shows a fourth example of a voltage boosting circuit.

A further solution is a charge pump circuit as shown in FIG. 9. There are many different implementations of charge pump circuit, only one example of which is provided. The circuits again use combinations of diodes and capacitors. Often they also require switching elements such as transistors or phase delay circuits to realize a proper functionality. Although these circuits are not excluded, a solution without such additional switching elements is shown in FIG. 9.

The circuit comprises a chain of three diodes D11, D12, D13. A first charge pump capacitor C11 is across the first two diodes D11 and D12, and a second charge pump capacitor C12 is across the last two diodes D12 and D13.

The capacitors C11 and C12 are used to pump charge to the final smoothing capacitor C13. This happens during each positive pulse of the driving input voltage. The diodes prevent a discharge of the pumping capacitors C11 and C12 as well as the smoothing capacitor. Also charge pumps can be easily cascaded, hence high output voltage can be generated.

The capacitor C11 is charged by current flow from the input and the capacitor C12 is charged by current flow from the output. There are two charging cycles, based on whether a positive pulse is present at the input. Between each cycle, there is a step change in voltages at the terminals of C11 with the result that charge is pumped between the capacitors, thereby maintaining the output voltage at a raised voltage level compared to the input.

Figure 10:
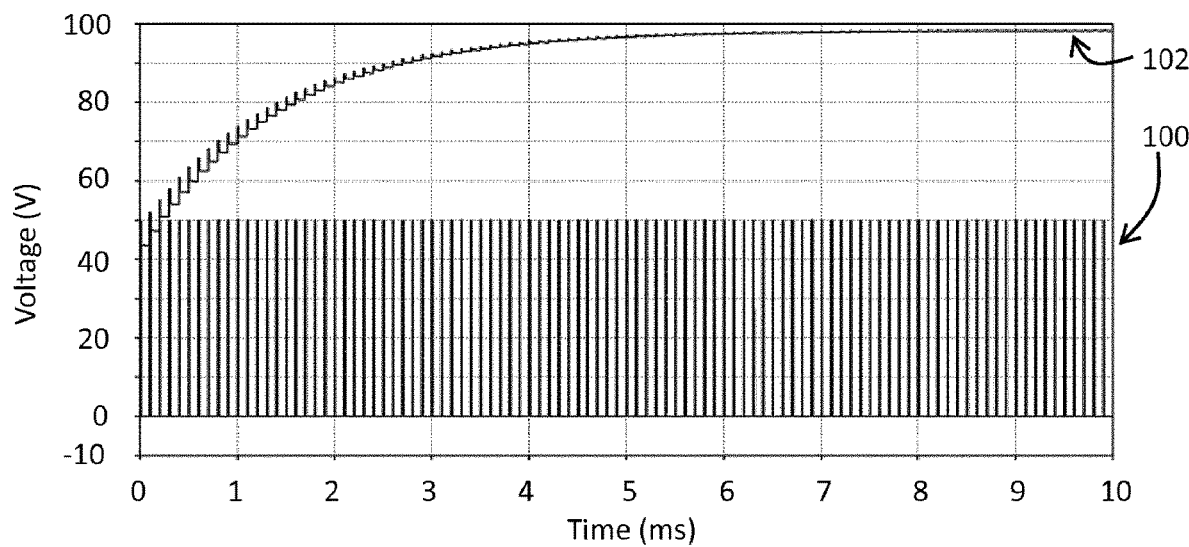
FIG. 10 shows a timing diagram to show the operation of the circuit of FIG. 9.

FIG. 10 shows the input voltage 100 as a series of pulses and shows the output voltage 102. Usually rectangular-shaped pulses are used as the input voltage as shown. However other waveforms may be used as well. In addition a DC bias voltage can be applied to the input, further boosting the output voltage.

Charge pumps also can be used to generate negative operation voltages and even can be configured to generate an output voltage with a different polarity then the input voltage. They are also scalable to increase the output voltage further. Numerous active and passive charge pump circuits will be known to those skilled in the art.

As outlined above, the invention is based on the formation of at least capacitors using the EAP layer, for use in a voltage boosting circuit. The part or parts of the EAP layer used for the capacitor may be non-active regions, i.e. regions which do not form part of the actuation area. However, as will be explained below, active regions might be used as well.

The capacitor, and any other components which are formed using the EAP layer in accordance with the invention, functions as an electrical circuit component for processing an electrical input signal and for generating a processed electrical output signal. Although the EAP material has intrinsic electrical to mechanical conversion functionality, this is not used as part of the circuit component function.

Single layer or multilayer constructions or combinations of both can be used to realize capacitive functionality in combination with electroactive polymers, hence a multifunctional EAP can be created. In addition, passive or active components such as the diodes shown in the circuits above can be mounted on dedicated footprints directly on the device or connected to it via defined terminals. This integrated functionality has advantages as discussed above. By way of example, a coil may be used in combination with a serial switch (such as field effect transistor) to implement a switching circuit, which serves to pre-boost (e.g. from 5 V to 100 V) the input of the following voltage boosting solution. Serial switch-inductor circuits are indeed known in switch mode power supply circuits.

Figure 11:
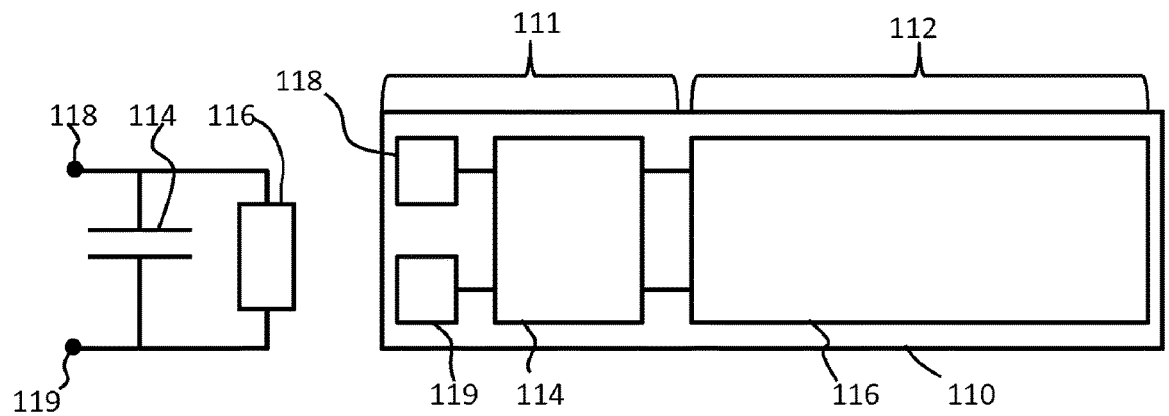
FIG. 11 shows a first example of an EAP actuator with integrated control circuit.

A first example of integrated capacitor circuit is shown in FIG. 11.

FIG. 11 (and FIGS. 12 to 15 and 17) shows a plan view of the layout of components, but only in schematic form. Essentially, it shows only the portion of the EAP layer used to form the different components. A capacitor is shown as a single rectangle. This represents an upper electrode and a lower electrode with the EAP layer between functioning as the dielectric. The capacitor may be a pair of electrodes with the full single-layer EAP structure formed between, or there may be multiple electrode layers, each with an EAP layer between as the dielectric layer, with multiple such dielectric layers forming a multilayer stack. Two electrical connections to and from the capacitor are shown, but these are to the two capacitor electrodes (at different heights within the structure). Similarly, contacts to the capacitor terminals require connections to different heights within the structure, and through vias are used for this purpose so that any eventual external contact are at surface level. These details of how to implement multi-layer circuit structures are all routine to those skilled in the art.

This is a simplest approach for the multifunctional electroactive polymer device. The EAP layer 110 is formed as a passive region 111 and an active region 112. The active region is the part of the device which is intended to deform in response to an actuation signal. The passive region 111 has an integrated capacitor 114, whereas the active region has electrodes which define the actuator 116. Two electrical contacts 118, 119 function as input and ground (or in general, any reference potential). The two electrical contacts do not need to be on the same side of the device, but also can be on opposite sides.

The capacitor (or other components) in the passive region 111 are thus designed to provide an electrical signal processing function which does not rely on the deformation of the EAP layer in the passive region.

The passive region is thus mechanically passive, by which is meant there is no controlled mechanical input or controlled mechanical output. The deformation may be isolated from the passive region or else the influence of the deformation on the performance of the components in the passive region may be treated as circuit component tolerances, and the circuits are then designed taking account of those tolerances.

FIG. 11 also shows the circuit schematic, and it shows the EAP actuator 116 in parallel with a smoothing capacitor 114.

This smoothing capacitor is for example a stage of an overall voltage boosting control circuit and the smoothing capacitor performs part of the voltage boosting control of the driving of the actuator.

It is desirable that the actuation function does not influence the operation of the control circuit (in this case just a simple capacitor, but a more complicated circuit in further examples below). The movement of the EAP actuator should therefore be isolated from the control circuit. This may be ensured by defining a mechanically non-active part of the EAP layer 110 between the control circuit (the capacitor 114 in this example) and the EAP actuator 116, for example by having an area without any covering material layer, whereas such a covering layer (with different mechanical expansion coefficients) is used in the EAP actuator. However, the mechanical deformation caused by the actuation typically provides a reduced layer thickness, which in turn increases the capacitance which may be tolerable in an electric circuit.

Figure 12:
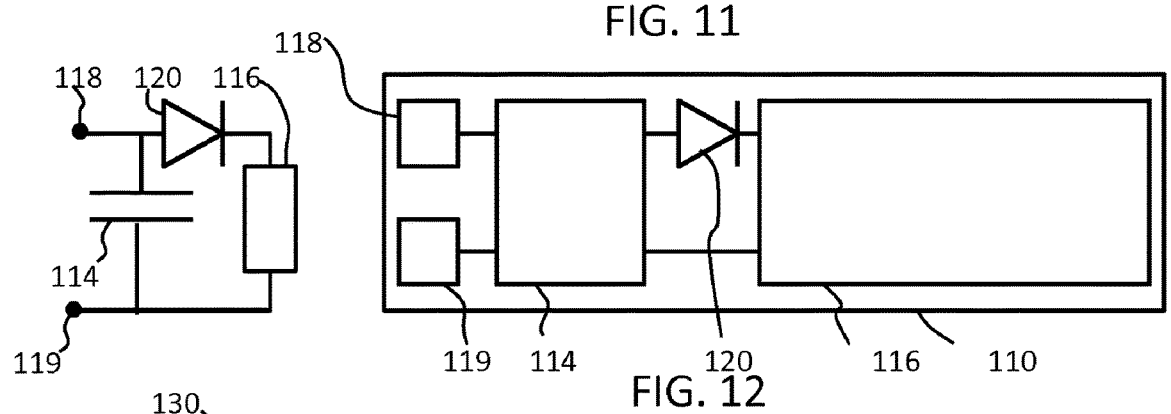
FIG. 12 shows a second example of an EAP actuator with integrated control circuit.

FIG. 12 shows a second example of circuit comprising an EAP actuator with a circuit comprising a capacitor and a diode. The diode 120 is provided between an electrode of the capacitor 114 and an electrode of the actuator 116. It is for example a discrete external component mounted over the EAP layer.

As shown in the schematic circuit diagram, the diode 120 is in series between one capacitor terminal and one actuator terminal. This diode can have different functions such as rectifying an input signal or protecting an EAP actuator from unwanted high voltage amplitudes with the wrong polarity or preventing the EAP device having a discharge path via the driving electronics. The position of the diode may be different such as between the input terminal and smoothing capacitor.

Figure 13:
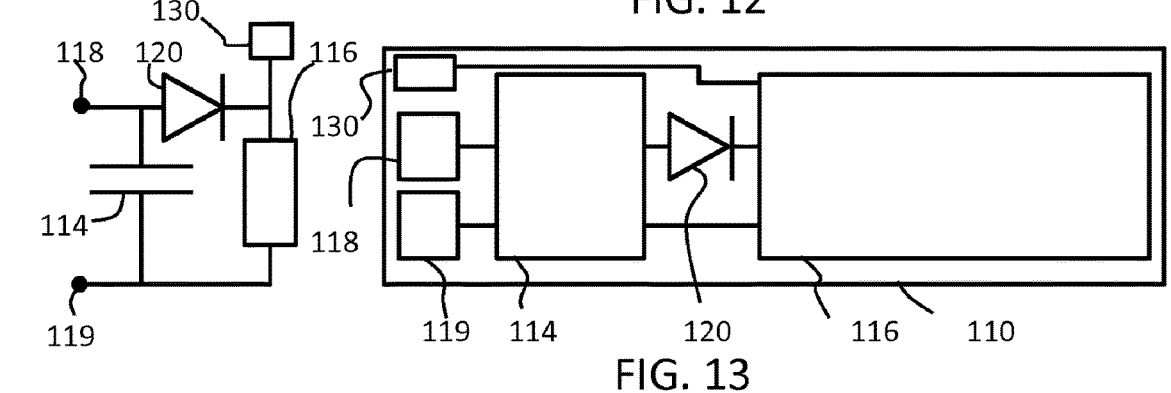
FIG. 13 shows a third example of an EAP actuator with integrated control circuit.

Although such an implementation of a diode may have advantages it also reduces the deactivation time of an EAP actuator since the actuator can deactivate only via internal parasitic capacitances. FIG. 13 shows an arrangement in which the device is provided with at least one more electrical terminal 130 for fast deactivation (for example using a switch or transistor).

Figure 14:
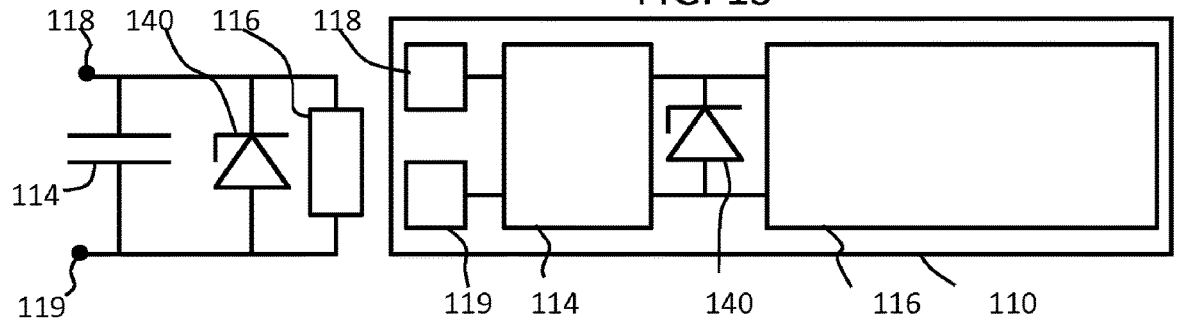
FIG. 14 shows a fourth example of an EAP actuator with integrated control circuit.

Instead of standard diodes, Zener diodes may be used to protect the EAP from unwanted high voltage amplitudes. FIG. 14 shows an example with a Zener diode 140 in parallel with the EAP actuator 116.

In the same way as shown above, more components can be added in different combinations. Especially resistors, inductors, transistors and the like may be added in series, parallel or in mixed configurations to increase the functionality.

Figure 15:
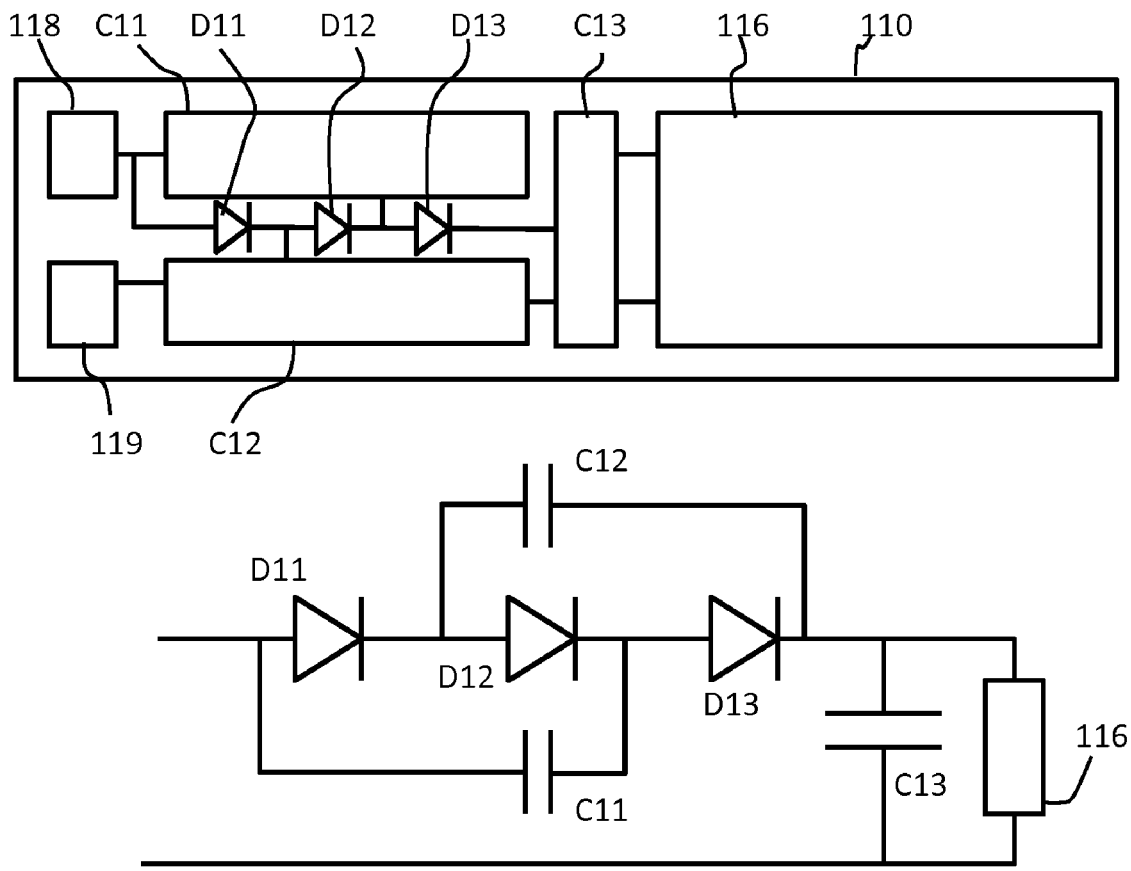
FIG. 15 shows a fifth example of an EAP actuator with integrated control circuit.

FIG. 15 shows an example using a voltage multiplication circuit.

The circuit is based on the circuit of FIG. 9 and the same references are used for the circuit components. The voltage multiplication stage thus comprises two pumping capacitors C11, C12, a smoothing capacitor C13 and three diodes D11, D12, D13. Other topologies and cascaded structures are possible as well.

This voltage multiplication stage is voltage doubler, but a higher multiplication level may be more beneficial in certain cases. As described above, voltage doublers may be stacked to increase the multiplication factor. Alternatively, a voltage tripler may be used.

Figure 16:
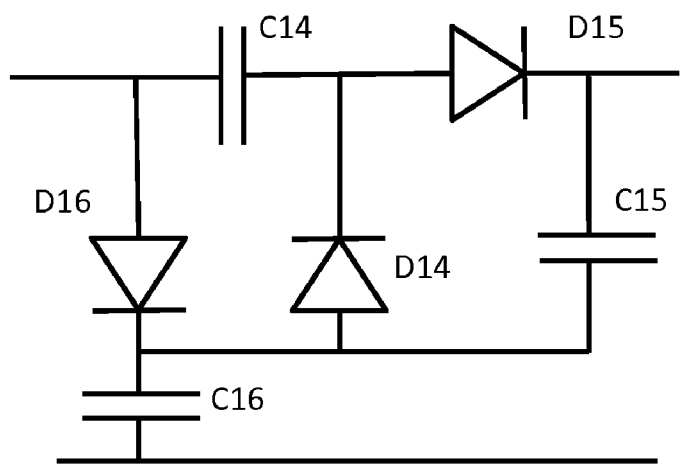
FIG. 16 shows a voltage tripler circuit which may also be integrated with the EAP actuator.

FIG. 16 shows an example of voltage tripler circuit. This requires three charge pump capacitors C14, C15, C16 and three diodes D14, D15, D16. Although more capacitance area is needed, the EAP layer has enough area for more capacitance particularly if a multilayer structure is used.

In the example of FIG. 13 an additional terminal is used to discharge the device. More terminals may be added to enable connection of other electrical components and elements.

Figure 17:
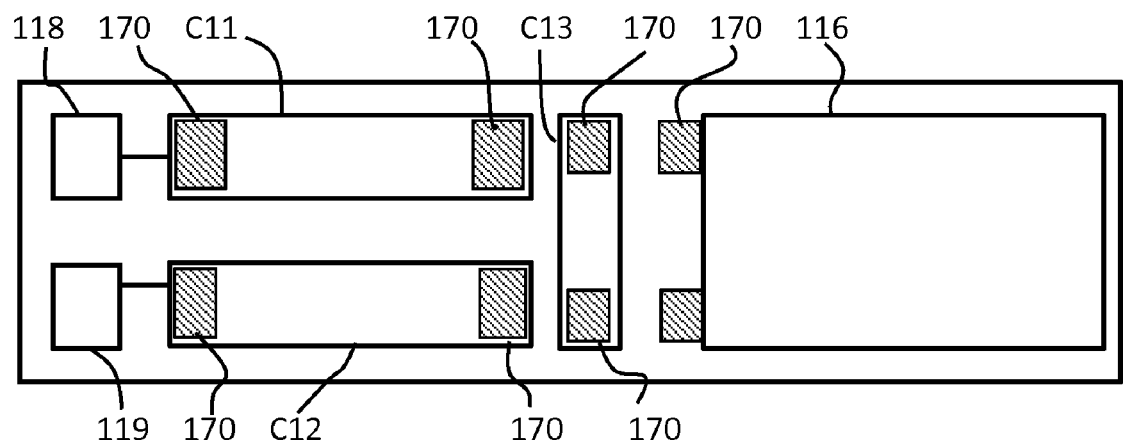
FIG. 17 shows a sixth example of an EAP actuator with integrated control circuit.

FIG. 17 shows an example based on the components of FIG. 15 but with no internal connections. Instead, terminals 170 are provided which enable connection to the capacitor terminals and to the actuator terminals. Thus, there are integrated capacitors but several additional terminals 170 allowing for different configurations to be formed. Hence, by connecting components and/or electrical shorts to these terminals 170, a user may be flexible in generating a circuit configuration according to the requirements of a specific application.

Instead of using external diodes, and having terminals for interconnection to external diodes (or other passive elements), the EAP device can make use of with thin film diodes which can be integrated between the layers of an EAP multilayer stack. Thin film diodes such as metal-insulator-metal (MIM) diodes are extremely thin structures which could be integrated in a circuit foil in between the layers of the EAP stack. Thin film transistors may also be incorporated into the EAP multilayer stack structure.

For example, MIM diodes, of a gold-pentacene-aluminum configuration, with a reverse bias breakdown strength of more than 100 V are known, i.e. within the EAP voltage range. For (monolayer) dielectric elastomers, high driving voltages in the kV range are required. For multilayer EAPs, lower driving voltages may be used, for example up to about 250 V are required. The layer thickness of the EAP is reducing as the technology advances, enabling lower driving voltage amplitudes.

The output voltage of the voltage boosting solution depends on the input voltage, which may also be increased using techniques known in the field of switch mode power supplies. The boosting further can be increased by cascading more sections, for example multiple stages of the circuits of FIGS. 7 and 9.

An intermediate DC voltage (e.g. 50 V) may be used as a DC supply for a next voltage boosting section, thereby forming a rectangular function generator.

Several of the diodes could be connected in series to increase the breakdown voltage even more. Thus, in all examples above, instead of using discrete diodes, metal-insulator-metal (organic) thin film diodes may be used.

The examples above all provide the additional circuit elements, including capacitors and optionally also diodes, outside the active area where the actuator is designed to deform.

Figure 18:
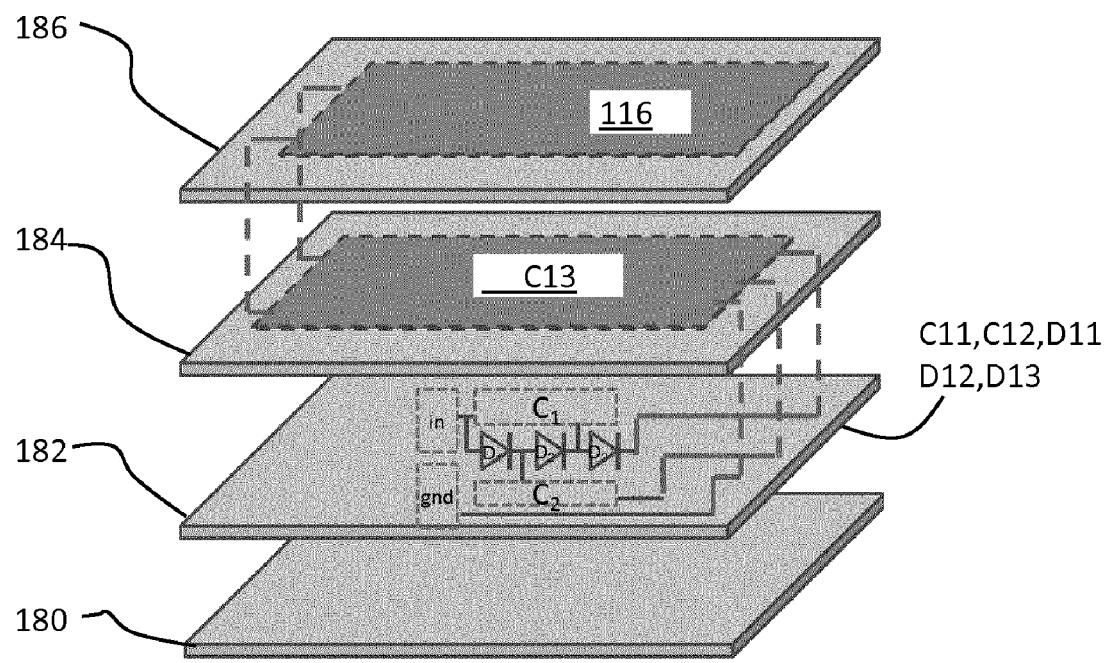
FIG. 18 shows how capacitors and diodes may be integrated into the structure of the EAP actuator and also at the active part of the EAP layer.

The capacitors may however also be formed in the active area 112 of the EAP. An example is shown in FIG. 18, based on the circuit of FIG. 15.

The device comprises a layered structure over a passive substrate 180.

A first layer 182 carries the charge pump capacitors C11, C12 and the diodes D11, D12, D13. A second layer 184 carries the smoothing capacitor C13. A third layer 186 carries the actuator electrode of the EAP actuator 116.

This is of interest for an EAP configuration with limited space for any non-active area. This may for example be the case where an array of EAP actuators is desired. The various capacitors are integrated in the active area of the EAP by stacking vertically. The charge pump circuit C11 and C12 has the lowest applied voltage for this reason is it at the layer closest to the passive substrate, close to the neutral line. The smoothing capacitor and the EAP actuator provide deformation when voltage is applied, and they are situated further away from the neutral line. Vertical interconnects are made by through vias through the non-active parts of the EAP stack (not shown in detail).

As mentioned above, one application is in matrix devices. Diodes may be used to create an array of EAPs where each EAP is at the crossover point of the array and uses either a MIM diode or the double diode and reset driving scheme. In this way passive matrix arrays, with diode switches at the array elements, may be formed as an integrated structure.

Typically, the dielectric constant of an EAP material is in the range of 3 to 5. Additional layers may be used to alter the dielectric properties.

Assuming simple rectangular configurations for an integrated capacitor:

$$C = n\varepsilon_0 \varepsilon_r ab/d$$

(a, b=length, width, d=thickness of the dielectric layers, n=number of layers, $\varepsilon_0$=permittivity of free space, $\varepsilon_r$=relative permittivity). By way of example there may be 10 to 200 layers each with 3-5 µm thickness. The voltage boosting area does not need not to be optimized for any mechanical deformation. By way of example, 100 layers of 1 µm thickness may be assumed, which corresponds to the thickness of active EAP actuator part.

If a capacitance is chosen corresponding to that typically used in a voltage boosting stage, such as C=100 nF, the lateral area required is ab=22.6 mm$^2$. Thus, the linear dimensions required are of the order of mm. for example with a required area less than 100 mm$^2$. The capacitor area is for example less than the active area of the actuator.

This shows that the space required to implement a desired capacitance level does not cause the overall area of the device to be dominated by the capacitor.

If the capacitance is reduced (and hence required area), the effect would be that the activation voltage of the EAP would reach its final value a bit later, so the EAP may react slightly more slowly, but depending on the load conditions.

An example of a typical active dimension of an EAP actuator is is 15 mm×12 mm=180 mm$^2$. Taking the (non-optimized) example of 22.6 mm$^2$, one 100 nF capacitor would increase the EAP area by 22.6/180=12.5%. Often only two boosting capacitors are required, and the smoothing capacitor may become unnecessary, because the EAP itself will behave as smoothing capacitor.

The integrated device described above based on a charge pump circuit may for example enable the required input voltage to the device to be reduced, improving the safety of the component and improving electromagnetic performance. The device may be extremely flat and flexible without requiring any high voltage connections.

Materials suitable for the EAP layer are known.

Electro-active polymers include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-tri-fluoroethylene-chlorofluoroethylene (PVDF-TrFE-CFE), Polyvinylidene fluoride-trifluoroethylene-chlorotrifluoro-ethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

In more detail, IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

In all of these examples, additional passive layers may be provided for influencing the electrical and/or mechanical behavior of the EAP layer in response to an applied electric field.

The EAP layer of each unit may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The invention can be applied in many EAP and photoactive polymer applications, including examples where a passive matrix array of actuators is of interest.

In many applications the main function of the product relies on the (local) manipulation of human tissue, or the actuation of tissue contacting interfaces. In such applications EAP actuators for example provide unique benefits mainly because of the small form factor, the flexibility and the high energy density. Hence EAP's and photoresponsive polymers can be easily integrated in soft, 3D-shaped and/or miniature products and interfaces. Examples of such applications are:

Skin cosmetic treatments such as skin actuation devices in the form of a responsive polymer based skin patches which apply a constant or cyclic stretch to the skin in order to tension the skin or to reduce wrinkles;

Respiratory devices with a patient interface mask which has a responsive polymer based active cushion or seal, to provide an alternating normal pressure to the skin which reduces or prevents facial red marks;

Electric shavers with an adaptive shaving head. The height of the skin contacting surfaces can be adjusted using responsive polymer actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of responsive polymer transducers which is integrated in or near the user interface;

Catheters with a steerable tip to enable easy navigation in tortuous blood vessels;

Measurements of physiological human body parameters such as heart beat, SpO2 and blood pressure.

Another category of relevant application which benefits from such actuators relates to the modification of light. Optical elements such as lenses, reflective surfaces, gratings etc. can be made adaptive by shape or position adaptation using these actuators. Here one benefit of EAPs for example is a lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An actuator device, comprising:
    an electroactive polymer actuator;
    an electroactive polymer layer; and
    a control circuit, the control circuit arranged to drive the electroactive polymer actuator,
        wherein the control circuit comprises a voltage boosting circuit,
        wherein the voltage boosting circuit comprises at least one capacitor,
        wherein the electroactive polymer layer comprises an active region and a mechanically passive region,
        wherein the active region is arranged to deform as a function of an applied actuation signal, and
        wherein the active region forms at least a part of the electroactive polymer actuator and the mechanically passive region forms at least a part of a dielectric of the at least one capacitor.

2. The actuator device as claimed in claim 1,
    wherein the control circuit further comprises a voltage smoothing portion, and
    wherein the voltage smoothing portion comprises the at least one capacitor electrically connected in parallel with the electroactive polymer actuator.

3. The actuator device as claimed in claim 1, wherein the control circuit further comprises at least one diode.

4. The actuator device as claimed in claim 3, wherein the at least one diode is an external component which connects to external terminals on the electroactive polymer layer.

5. The actuator device as claimed in claim 3, wherein the at least one diode is a thin film layer device integrated into the electroactive polymer layer.

6. The actuator device as claimed in claim 5, wherein the at least one diode is a metal-insulator-metal (MIM) diode.

7. The actuator device as claimed in claim 3,
    wherein the control circuit comprises the at least one diode in series with the electroactive polymer actuator, and
    wherein the at least one capacitor is arranged in parallel with the series connection of the electroactive polymer actuator and the at least one diode.

8. The actuator device as claimed in claim 7,
    wherein the control circuit further comprises a discharge terminal, and
    wherein the discharge terminal is connected to a junction between the electroactive polymer actuator and the at least one diode.

9. The actuator device as claimed in claim 3,
    wherein the control circuit comprises the at least one diode in parallel with the electroactive polymer actuator, and
    wherein the at least one capacitor is arranged in parallel with the electroactive polymer actuator.

10. The actuator device as claimed in claim 3, wherein the control circuit is a charge pump voltage boosting circuit.

11. The actuator device as claimed in claim 10,
    wherein the control circuit further comprises a first capacitor, a second capacitor, and a diode arrangement, and
    wherein each of the first capacitor and the second capacitor has their dielectric formed by the electroactive polymer layer.

12. The actuator device as claimed in claim 11, wherein the control circuit further comprises a voltage doubler circuit or a plurality of voltage doubler circuits, or a voltage tripler circuit or a plurality of voltage tripler circuits.

13. The actuator device as claimed in claim 1,
    wherein the electroactive polymer layer comprises a first portion and a second portion, and
    wherein the first portion forms the electroactive polymer actuator and the second portion forms the dielectric of the at least one capacitor.

14. The actuator device as claimed in claim 1, wherein the at least one capacitor is formed within an actuator area of the actuator device.

15. A method of driving an actuator device, wherein the actuator device comprises an electroactive polymer actuator, the method comprising:
    generating a drive signal using a voltage boosting control circuit, wherein the voltage boosting control circuit comprises at least one capacitor; and
    applying the drive signal to the electroactive polymer actuator,
        wherein the actuator device further comprises an electroactive polymer layer,
        wherein the electroactive polymer layer comprises an active region and a mechanically passive region,
        wherein the active region is arranged to deform as a function of an applied actuation signal, and
        wherein the active region forms at least a part of the electroactive polymer actuator and the mechanically passive region forms at least a part of a dielectric of the at least one capacitor.

16. The method as claimed in claim 15,
    wherein the voltage boosting control circuit further comprises a voltage smoothing portion, and
    wherein the voltage smoothing portion comprises the at least one capacitor electrically connected in parallel with the electroactive polymer actuator.

17. The method as claimed in claim 15, wherein the voltage boosting control circuit further comprises at least one diode.

18. The method as claimed in claim 17, wherein the at least one diode is an external component which connects to external terminals on the electroactive polymer layer.

19. The method as claimed in claim 17, wherein the at least one diode is a thin film layer device integrated into the electroactive polymer layer.

20. The method as claimed in claim 17,
    wherein the voltage boosting control circuit comprises the at least one diode in series with the electroactive polymer actuator, and wherein the at least one capacitor is arranged in parallel with the series connection of the electroactive polymer actuator and the at least one diode.

* * * * *